United States Patent
Molina et al.

(10) Patent No.: US 8,411,707 B2
(45) Date of Patent: Apr. 2, 2013

(54) LOW POWER, HIGH SPEED MULTI-CHANNEL DATA ACQUISITION SYSTEM AND METHOD

(75) Inventors: Johnnie F. Molina, Tucson, AZ (US); Hugo Cheung, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 796 days.

(21) Appl. No.: 12/587,439

(22) Filed: Oct. 7, 2009

(65) Prior Publication Data

US 2011/0080925 A1 Apr. 7, 2011

(51) Int. Cl.
*H04J 3/02* (2006.01)
(52) U.S. Cl. .................................. 370/537
(58) Field of Classification Search .............. 370/464, 370/498, 537, 538, 540, 545
See application file for complete search history.

(56) References Cited

U.S. PATENT DOCUMENTS

| | | | |
|---|---|---|---|
| 6,304,199 B1 * | 10/2001 | Fang et al. ............ | 341/118 |
| 2006/0255832 A1 * | 11/2006 | Speers et al. .......... | 326/39 |
| 2008/0309393 A1 * | 12/2008 | Sun et al. .............. | 327/298 |
| 2009/0052575 A1 * | 2/2009 | Waheed et al. ........ | 455/126 |
| 2009/0054018 A1 * | 2/2009 | Waheed et al. ........ | 455/126 |

OTHER PUBLICATIONS

Specification Sheet for ADS7866, ADS7867, ADS7868 1.2-V, 12-/10-/8 Bit, 200-KSPS/100-KSPS, Micro-Power, Miniature Analog-To-Digital Converter With Serial Interface, Burr-Brown Products from Texas Instruments, Copyright © 2005, Texas Instruments Incorporated.

* cited by examiner

*Primary Examiner* — Kerri Rose
(74) *Attorney, Agent, or Firm* — Alan A. R. Cooper; Wade J. Brady, III; Frederick J. Telecky, Jr.

(57) ABSTRACT

In a data acquisition system, digitizing circuitry (2A) is powered up by a control signal (ADC_CONVST), superimposing a glitch (42-1) on a first multiplexed and amplified signal value ($V_{INF}$) received by the digitizing circuitry. Sampling and holding of the first multiplexed and amplified signal value occurs during a delay provided between the glitch and a beginning of a first A/D conversion of the first multiplexed and amplified signal value to allow settling of the glitch. After the first conversion begins, a second multiplexed and amplified signal value is generated. The digitizing circuitry performs the first A/D conversion during initial settling of the second multiplexed and amplified signal value and then is powered down while the second multiplexed and amplified signal value continues to settle.

18 Claims, 4 Drawing Sheets

LOW POWER, HIGH SPEED MULTI-CHANNEL DATA ACQUISITION SYSTEM AND METHOD

BACKGROUND OF THE INVENTION

The present invention relates generally to low power, relatively high speed (e.g., with sample rates of roughly 100 kilosamples per second (KSPS)) data acquisition circuitry, especially to multi-channel data acquisition circuitry that includes SAR (successive approximation register) ADCs (analog to digital converters).

FIG. 1 shows a SAR ADC conversion circuit 1 which is included in the assignee's commercially available ADS 7866 data acquisition product. SAR ADC conversion circuit 1 receives the amplified output voltage produced by an input amplifier 17. The output of input amplifier 17 can be filtered by an external RC filter 29. Input amplifier 17 receives and amplifies the filtered analog input signal $V_{IN}$ that ultimately is to be digitized. SAR ADC conversion circuit 1 includes a low-power SAR ADC 2 and a conversion and control logic circuit 10.

SAR ADC 2 includes a sample/hold circuit 3 having a (+) input connected to receive the filtered signal $V_{INF}$ produced by filter 29. The (−) input of sample/hold circuit 3 is connected to ground or other suitable reference voltage. The differential output of sample/hold circuit 3 is connected to the inputs of a CDAC (capacitor digital to analog converter) circuit 4 which is controlled via a digital bus 8 by means of a SAR (successive approximation register) 7. The output of CDAC 4, which can include a main CDAC and a dummy CDAC, is coupled to the input of a SAR comparator 5, the output of which is connected by conductor 6 to SAR 7. The resulting digital output DATA of SAR 7 is coupled by a digital bus 9 to conversion and control logic circuit 10.

Conversion and control logic circuit 10 operates in accordance with a serial clock signal SCLK, a power up/down signal CS, a serial data input signal SDI, and a serial data output signal SDO. Bus 25 couples various control signals to SAR 7. A mid-range reference voltage Vmid for SAR comparator 5 is produced by a resistive voltage divider (not shown, but similar to R1, R2 in FIG. 4) which dissipates a substantial amount of power.

Low power SAR ADC 2 in FIG. 1 is switched to a "powered down" state when it is not in the process of digitizing an analog input signal, and is switched to a powered up state only when SAR ADC 2 is required to digitize an analog input signal. The above mentioned resistive voltage divider which supplies a reference voltage Vmid to the input of sample/hold circuit 3 is also powered down and up at the same times as SAR ADC 2. When SAR ADC 2 is switched to its powered up state, it then samples the input analog signal $V_{INF}$ received from input amplifier 17 and filter 29, and then performs an analog to digital conversion of the sampled $V_{INF}$ signal.

Unfortunately, as SAR ADC 2 is being powered up it causes a substantial amount of charge to flow from its input back to the output of input amplifier 17, as does charge left on the capacitors of CDAC 4 from the previous conversion. This causes a power-up "glitch" on the outputs of input amplifier 17 and filter 29, and this power-up glitch must be allowed to settle before accurate sampling of $V_{INF}$ can be accomplished by sample/hold circuit 3 so that accurate digitizing of $V_{INF}$ can be accomplished. The power-up current flow from the ADC input can be thought of as a current transient to filter 29 and amplifier 17 that causes the power-up glitch to be generated. Unfortunately, input amplifier 17 must be a high-bandwidth amplifier, and therefore also must be a high power amplifier, in order to achieve the fast settling of the power-up glitch required for a high data throughput rate before starting the analog to digital conversion of $V_{INF}$.

FIG. 2 shows a timing diagram of the power up/down signal CS and an internal ADC clock signal ADC CLK which both control the operation of SAR ADC conversion circuit 1 of FIG. 1. SAR ADC 2 is powered up as soon as the falling edge of power up/down signal CS occurs. The analog to digital conversion process by SAR ADC 2 begins at the falling edge of pulse #2 of ADC CLK. Sampling and settling of $V_{INF}$ by sample/hold circuit 3 begins immediately in response to the falling edge of CS and continues during the first two cycles of ADC CLK. Analog to digital conversion begins immediately after the falling edge of pulse #2 of ADC CLK and continues until the falling edge of pulse #15 of ADC CLK. SAR ADC 2 then is powered down immediately after the digital to analog conversion of the sample of $V_{INF}$ is complete, at essentially the same time that the rising edge of CS occurs.

In some prior multi-channel data acquisition systems (not shown), a multiplexer is used to successively route multiple analog input signals to the input of an input amplifier such as amplifier 17, which amplifies the analog input signals and presents an amplified signal to the input of the SAR ADC of the multi-channel data acquisition system. In such multi-channel data acquisition systems it has been necessary to wait until the previous ADC conversion has occurred before switching the multiplexer to the next channel to be sampled.

In such prior multi-channel data acquisition systems, a first analog to digital conversion is completed for the first channel, and only after the conversion of a first analog input signal is complete is the multiplexer switched to a second channel to begin analog to digital conversion of a second analog input signal. A problem with such prior multi-channel data acquisition systems is that to achieve high data throughput rates, it is not only necessary to allow only a very small amount of time for the input amplifier 17 to recover from the above mentioned power-up glitch, but it is also necessary to allow the outputs of the input amplifier 17 and filter 29 to settle to a new voltage level that is proportional to the magnitude of the analog input signal on the second channel to which the multiplexer is to be switched.

Since the only way to achieve the desired small recovery times needed to achieve high data throughput rates for the above described multi-channel data acquisition systems has been to use a high bandwidth (and hence high power) input amplifier, the design of high-speed, low power, multiple-channel data acquisition systems has been very challenging.

Thus, there is an unmet need for a way to reduce the amount of bandwidth and power consumption of an input amplifier which supplies an analog input signal to be sampled for analog to digital conversion by means of a sample-and-hold circuit and an ADC in a data acquisition system.

There also is an unmet need for a way to reduce the amount of bandwidth and power consumption of an input amplifier which supplies an analog input signal to be sampled for analog to digital conversion in a data acquisition system which multiplexes multiple analog input signals into the input amplifier and successively digitizes the analog input signals by means of an ADC, for example a SAR ADC.

SUMMARY OF THE INVENTION

It is an object of the invention to provide higher speed and lower power consumption than has been achieved in prior art multi-channel data acquisition systems which supply analog input signals to be sampled for analog to digital conversion, for example by means of an ADC (other than a delta-sigma ADC), such as a successive approximation (SAR) ADC.

It is another object of the invention to provide a circuit and method for reducing the need to use a high bandwidth, high power input amplifier to produce an analog input signal to be sampled for analog to digital conversion in a data acquisition system by means of an ADC (other than a delta-sigma ADC), for example a SAR ADC.

It is another object of the invention to provide a circuit and method for reducing the need to use a high bandwidth, high power input amplifier which supplies an analog input signal to be sampled for analog to digital conversion in a data acquisition system which multiplexes multiple analog input signals into the input amplifier and successively digitizes the analog input signals by means of an ADC (other than a delta-sigma ADC), for example a SAR ADC.

Briefly described, and in accordance with one embodiment, the present invention provides a data acquisition system in which digitizing circuitry (2A) is powered up by a control signal (ADC_CONVST), superimposing a glitch (42-1) on a first multiplexed and amplified signal value ($V_{INF}$) received by the digitizing circuitry. Sampling and holding of the first multiplexed and amplified signal value occurs during a delay provided between the glitch and a beginning of a first A/D conversion of the first multiplexed and amplified signal value to allow settling of the glitch. After the first conversion begins, a second multiplexed and amplified signal value is generated. The digitizing circuitry performs the first A/D conversion during initial settling of the second multiplexed and amplified signal value and then is powered down while the second multiplexed and amplified signal value continues to settle.

In one embodiment, the invention provides a data acquisition circuit (12) including a multiplexer circuit (13) for receiving various input signals ($V_{IN0,1...7}$) and multiplexing them in accordance with a multiplexer address signal (MUX_ADDR) to generate various corresponding values of a multiplexer output signal ($V_{IN}$). An input amplifier (14) amplifies the multiplexer output signal ($V_{IN}$) to produce an amplified signal ($V_{INF}$). A sampling and holding circuit (3) has an input (18) coupled to an output of the input amplifier (14) to receive, sample, and hold the amplified signal ($V_{INF}$). A digitizing circuit (2A) digitizes the sampled and held amplified signal (33,34) to produce a digital signal (DATA) representative of the multiplexer output signal ($V_{IN}$). Control circuitry (21) controls a time at which at least a portion of the digitizing circuit (2A) is powered up for analog to digital conversion operation and controls a time at which the portion of the digitizing circuit (2A) is powered down to reduce power consumption, in response to a power control signal (ADC_CONVST). Powering up of the digitizing circuit (2A) causes a power-up glitch (42-1) on the input (18) of the digitizing circuit (2A). The control circuitry (21) also provides a first predetermined amount of time between the power-up glitch (42-1) and a beginning of a conversion process by the digitizing circuit (2A) to allow settling of the power-up glitch (42-1). The control circuitry (21) also provides a multiplexer address signal (MUX_ADDR) to cause the multiplexer circuit (13) to multiplex a next one of the input signals ($V_{IN0,1...7}$) so as to cause a corresponding next value of the amplified signal ($V_{INF}$) to occur at a beginning of a conversion of a previous sampled value of the amplified signal ($V_{INF}$) by the digitizing circuit (2A).

In one embodiment, the digitizing circuit includes a SAR ADC (successive approximation register analog to digital converter) (2A), and the first predetermined amount of time is sufficiently large to allow a bandwidth of the input amplifier (14) to be below a predetermined bandwidth that allows power dissipation of the input amplifier (14) to be below a predetermined level. In a described embodiment, the input amplifier (14) remains in a fully turned on condition during all conversion operation by the SAR ADC (2A). The SAR ADC (2A) begins to sample the corresponding next value of the amplified signal ($V_{INF}$) immediately after the conversion of the previous value of the amplified signal ($V_{INF}$). In one embodiment, a serial interface circuit (23) is coupled between the control circuitry (21) and an external host system, and a FIFO (First in, First out) register (26) is coupled between the control circuitry (21) and the serial interface circuit (23).

In one embodiment, the control circuitry (21) powers down the portion of the SAR ADC (2A) immediately after completion of any conversion by the SAR ADC (2A) and powers up the portion of the SAR ADC (2) a second predetermined amount of time after completion of that conversion by the SAR ADC (2), the second predetermined amount of time being sufficient to allow the next value of the amplified signal ($V_{INF}$) to settle. The input amplifier (14) is always powered up during multiplexing, sampling, and conversion operations of the data acquisition circuit (12). The portion of the SAR ADC (2) that is powered up and powered down includes a SAR comparator (5).

In one embodiment, a voltage divider includes first (R1) and second (R2) resistors coupled to produce a mid-range voltage (Vmid) and a buffer circuit (31) having an input coupled to receive and amplify the mid-range voltage (Vmid) and apply it as a reference voltage to the input (18) of the sampling and holding circuit (3). The sampling and holding circuit (3) includes first (S1) and second (S2) switches coupled between an output (32) of the buffer circuit (31) and the first (−) and second (+) inputs of the SAR comparator (5) for selectively coupling the reference voltage to the first (−) and second (+) inputs, respectively, of the SAR comparator (5) while the amplified signal ($V_{INF}$) is being applied to the capacitors of a CDAC (4) of the SAR ADC (2A).

In one embodiment, the invention provides a method of data acquisition including multiplexing a first of various input signals ($V_{IN0,1...7}$) in accordance with a multiplexer address signal (MUX_ADDR) to generate a corresponding first value of a multiplexer output signal ($V_{IN}$); amplifying the first value of the multiplexer output signal ($V_{IN}$) to produce a first value of an amplified signal ($V_{INF}$); powering up at least a portion of a digitizing circuit (2A) for analog to digital conversion operation in response to a power control signal (ADC_CONVST), wherein the powering up causes a power-up glitch (42-1) to be superimposed on the amplified signal ($V_{INF}$); beginning sampling and holding of the first value of the amplified signal ($V_{INF}$); providing a predetermined amount of time between the power-up glitch (42-1) and a beginning of an analog to digital conversion of the first value of the amplified signal ($V_{INF}$) by the digitizing circuit (2A) to a digital representation (DATA) thereof, to allow settling of the power-up glitch (42-1) before completing the sampling and holding of the first value of the amplified signal ($V_{INF}$); multiplexing a second of the input signals ($V_{IN0,1...7}$) so as to cause it to be amplified to a second value of the amplified signal ($V_{INF}$) after a beginning of the conversion of the first value of the amplified signal ($V_{INF}$) by the digitizing circuit (2A); operating the digitizing circuit (2A) to convert the first value of the amplified signal ($V_{INF}$) to the digital representation during settling of the second value of the amplified signal ($V_{INF}$); and powering down the portion of the digitizing circuit (2A) at the end of the conversion of the first value of the amplified signal ($V_{INF}$) to reduce power consumption.

In one embodiment, the digitizing circuit (2A) includes a SAR ADC (successive approximation register analog to digital converter) (2A), and the method includes providing a sufficiently large value of the predetermined amount of time to allow a bandwidth of an input amplifier (14) performing the amplifying to be below a predetermined bandwidth that allows power dissipation of the input amplifier (14) to be below a predetermined level.

In one embodiment, the method includes maintaining an input amplifier (14) which performs the amplifying in a fully turned on condition during all conversion operation by the SAR ADC (successive approximation register analog to digital converter) (2A).

In one embodiment, the method includes beginning sampling and holding of the second value of the amplified signal ($V_{INF}$) immediately after the conversion of the first value of the amplified signal ($V_{INF}$) is complete.

In one embodiment, the invention provides a data acquisition system (12) including means (13) for multiplexing a first of various input signals ($V_{IN0,1...7}$) in accordance with a multiplexer address signal (MUX_ADDR) to generate a corresponding first value of a multiplexer output signal ($V_{IN}$); means (14) for amplifying the first value of the multiplexer output signal ($V_{IN}$) to produce a first value of an amplified signal ($V_{INF}$); means (21) for operating a digitizing circuit (2A) to begin sampling of the first value of the amplified signal ($V_{INF}$); means (21, ADC_CONVST) for powering up a portion of the digitizing circuit (2A) for analog to digital conversion operation in response to a power control signal (ADC_CONVST),wherein the powering up of the digitizing circuit (2A) causes a power-up glitch (42-1) on an input (18) of the digitizing circuit (2A); means (15, 21, ADC_CLK) for providing a predetermined amount of time between the power-up glitch (42-1) and a beginning of conversion of the first value of the amplified signal ($V_{INF}$) by the digitizing circuit (2A), to allow settling of the power-up glitch (42-1); means (MUX_ADDR) for multiplexing a second of the input signals ($V_{IN0,1...7}$) so as to cause it to be amplified to a second value of the amplified signal ($V_{INF}$) after the beginning of a conversion of the first value of the amplified signal ($V_{INF}$) to a digital representation thereof by the digitizing circuit (2A); means (21,23,26) for operating the digitizing circuit (2A) to convert the first value of the amplified signal ($V_{INF}$) to the digital representation during settling of the second value of the amplified signal ($V_{INF}$); and means (10, 21, ADC_CONVST) for powering down the portion of the digitizing circuit (2A) at the end of the conversion of the first value of the amplified signal ($V_{INF}$) to reduce power consumption.

DETAILED DESCRIPTION OF THE PREFERRED EMBODIMENTS

Figure 1:
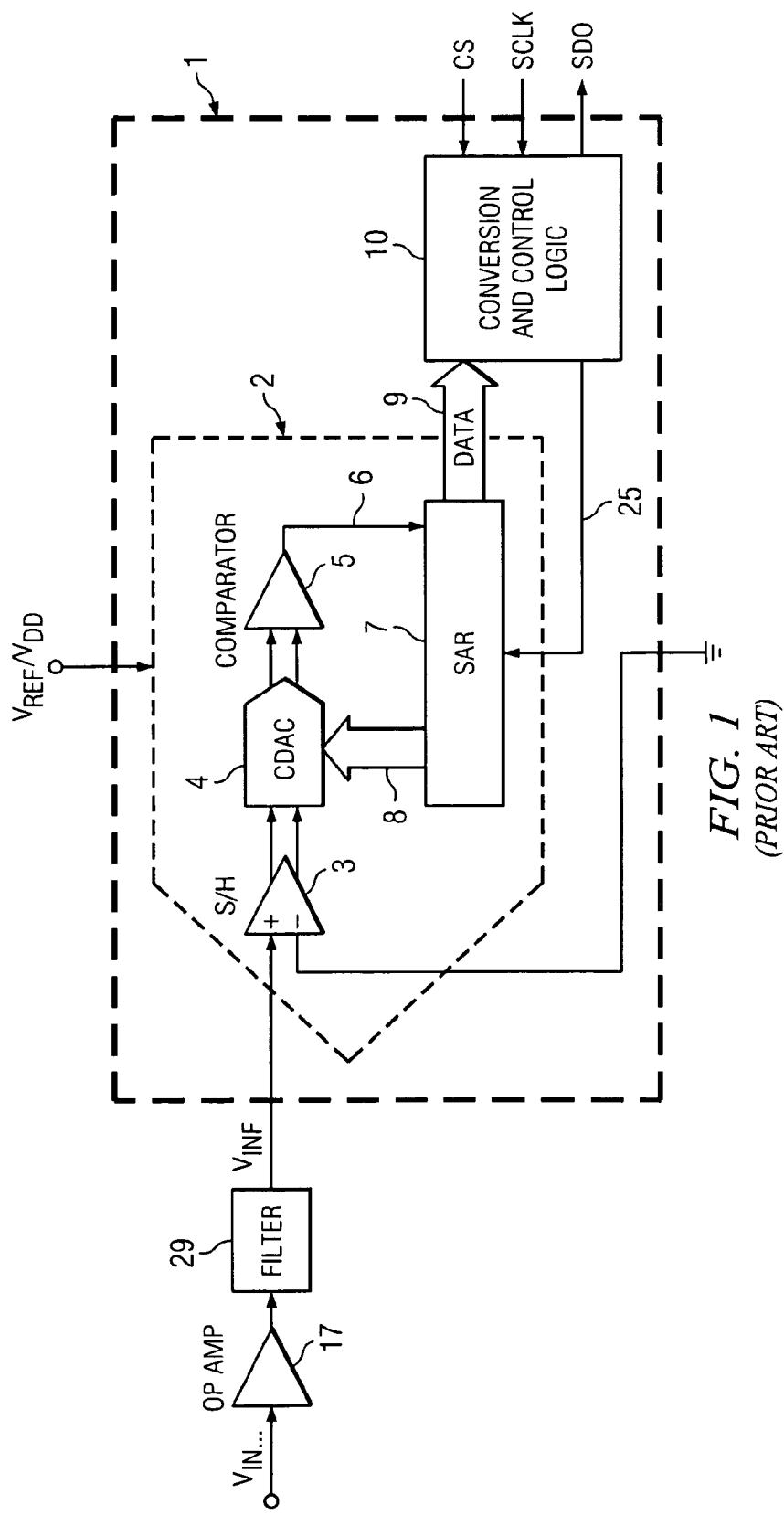
FIG. 1 is a block diagram of a prior art SAR ADC data acquisition system.
Figure 2:
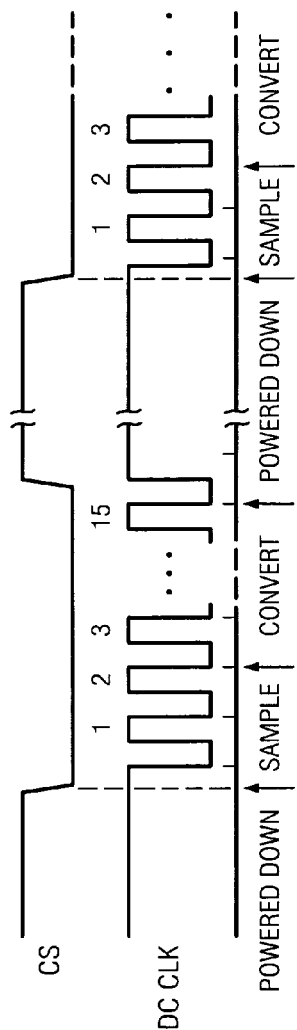
FIG. 2 is a timing diagram for the system of FIG. 1.
Figure 3:
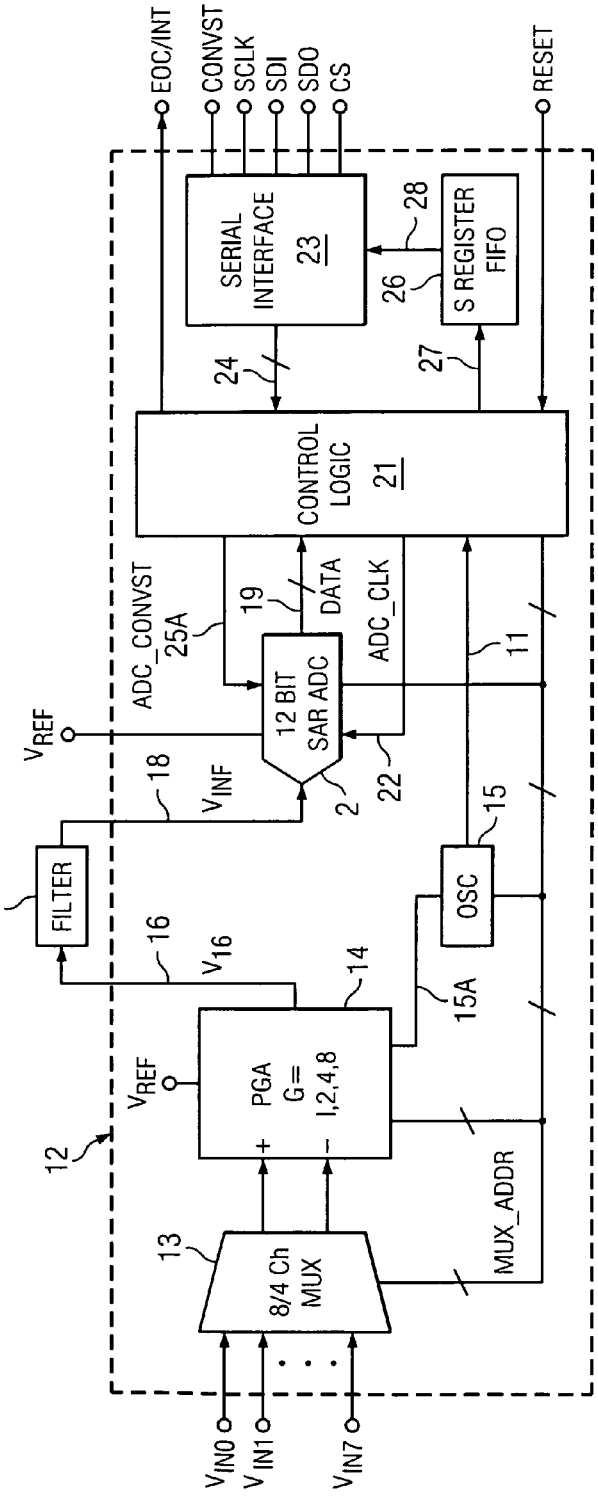
FIG. 3 is a block diagram of a data acquisition system in accordance with the present invention.

In FIG. 3, data acquisition system 12 includes a multiplexer 13 that multiplexes a number of analog input signals $V_{IN0,1...7}$ to provide the input voltage $V_{IN}$ of a differential programmable gain amplifier (PGA) 14 or other suitable amplifier. PGA 14 produces an amplified output voltage $V_{16}$ on conductor 16. PGA 14 can be a "continuous time", chopper stabilized, or switched capacitor sampling amplifier that is clocked in response to a clock signal produced on conductor 15A by an oscillator circuit 15. PGA output voltage $V_{16}$ can be coupled to the input of an external filter 29, the output signal $V_{INF}$ of which is coupled to the input 18 of a SAR ADC system 2 (which can be similar to SAR ADC 2 of Prior Art FIG. 1). SAR ADC system 2 may be a 12-bit ADC. SAR ADC system 2 is referenced to ground, and receives a reference voltage $V_{REF}$. SAR ADC system 2 is clocked by a signal ADC_CLK on conductor 22. Multiplexer 13 multiplexes analog input channels specified by a multiplexer address MUX_ADDR generated by control logic 21.

The digital output DATA of SAR ADC system 2 is coupled by bus 19 to control logic circuit 21 which, via a digital bus 24, receives information from a conventional serial interface circuit 23. Serial interface circuit 23 is coupled by conductor 28 to a serial FIFO (first in, first out) register 26, which performs the function of holding data for an external host system (not shown). FIFO register 26 receives data from control logic 21 via conductor 27. FIFO register 26 allows data from all of the multiplexer inputs to be held for the host system, which is coupled directly to serial interface circuit 23 and control logic 21. Data acquisition system 12 can be "powered down" completely without losing the data in FIFO register 26, because FIFO register 26 is implemented by means of conventional CMOS logic circuitry which draws essentially no DC power from the $V_{DD}$ supply; this results in significant power savings. The host system can then power up data acquisition system 12 to read the contents of FIFO register 26 whenever needed. Serial interface circuit 23 is coupled to receive an external start conversion signal CONVST, an external clock signal SCLK from which ADC_CLK is derived, a serial data input conductor on which a conventional serial input data signal SDI is received, a serial data output conductor on which a conventional serial output data signal SDO is generated, and a chip select input CS (which is entirely different than the power up/down signal CS of prior art FIG. 1). Serial interface circuit 23 also generates a power up/down signal ADC_CONVST on conductor 25A, based on start conversion signal CONVST.

Control logic 21 also is connected to generate an interrupt signal EOC/INT for the external host system. When the EOC/INT signal is programmed to be an "end of conversion" signal, it becomes "active" while the SAR ADC system 2 is performing an analog to digital conversion, so as to indicate a "busy" condition. When EOC/INT programmed to be an interrupt signal, it will be at an "active" level at the end of a conversion. Alternatively, EOC/INT can be programmed to signal other events (such as FIFO register 26 being in a full condition) to the host system. A reset signal RESET can be applied to control logic 21.

Oscillator 15 also produces an output signal on conductor 11 which is applied as an input to control logic 21. In response, control logic 21 generates ADC_CLK on conductor 22 in synchronization with SCLK, so as to introduce a sufficient amount of delay between the falling edge 41-1 of ADC_CONVST and the falling edge 44-1 of pulse #2 of ADC_CLK to allow subsequently described power-up glitch 42-1 (FIG. 5) to settle before SAR ADC system 2 begins the analog to digital conversion of $V_{INF}$, as shown in the timing diagram of subsequently described FIG. 5. Preferably, PGA 14 is a chopper stabilized amplifier. The timing of the chopper switching associated with the chopper stabilization of PGA 14 in response to oscillator 15 is synchronous with ADC_CLK, which is also produced in response to oscillator 15, so as to minimize noise during sampling of $V_{INF}$.

Control logic 21 generates an internal power control signal ADC_CONVST on conductor 25A to cause an SAR comparator 5 (FIG. 4) and associated bias circuitry (not shown) in SAR ADC system 2 to be in a powered up condition while SAR ADC system 2 is performing an analog to digital conversion, and also causes SAR comparator 5 to be in a powered down condition at other times. Powering up of SAR comparator 5 causes a substantial flow of current back through conductor 18 into the output of input amplifier 14, and that causes power-up glitches 42-1 and 42-2 in FIG. 5 to be superimposed on the corresponding values of $V_{INF}$. These power-up glitches must be allowed to completely settle before the corresponding values of $V_{INF}$ can be accurately sampled and digitized.

Figure 4:
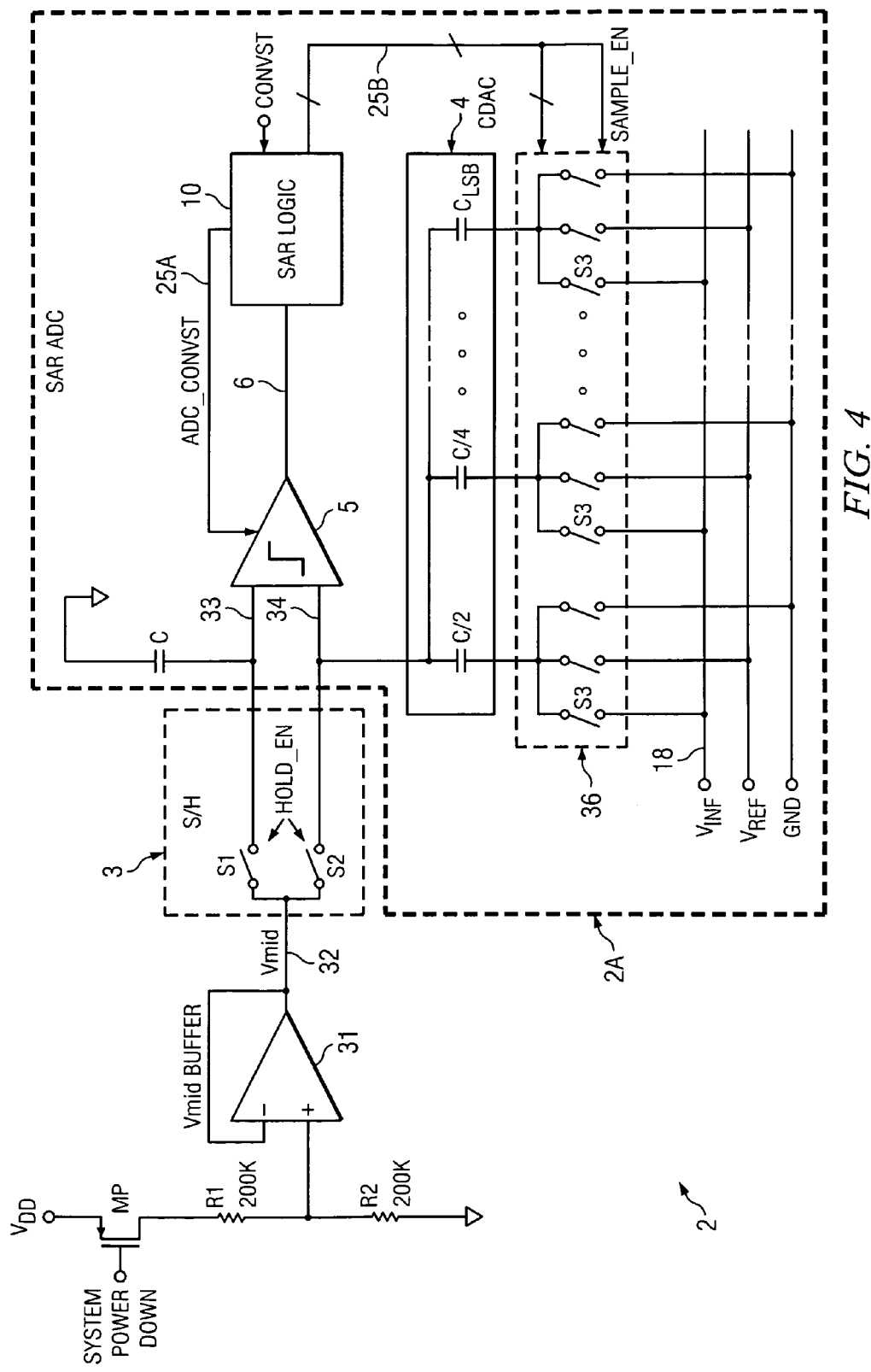
FIG. 4 is a schematic diagram that illustrates more detail of part of the block diagram of FIG. 3.

FIG. 4 shows more detail of SAR ADC system 2 of FIG. 3. SAR ADC system 2 includes a SAR ADC 2A in combination with the sample/hold circuit 3 and a mid-voltage reference circuit that includes a mid-voltage buffer 31 and a voltage divider R1 and R2. CDAC 4 of SAR ADC 22A includes a number of binarily weighted capacitors C/2, C/4 ... $C_{LSB}$, all having a separate "upper plate" terminal connected by conductor 34 to the (+) input of SAR comparator 5, each binarily weighted capacitor also having a "lower plate" conductor coupled to a corresponding set of three switches in block 36 controlled by a sample enable signal SAMPLE_EN to receive the ADC input signal $V_{INF}$ on conductor 18, the ADC reference voltage $V_{REF}$, and the ground voltage, respectively. A multi-conductor bus 25B is connected between SAR logic 10 and the multiple sets of 3 switches. Multi-conductor bus 25B conducts the signal SAMPLE_EN, which closes a switch S3 in each set of three switches within block 36 during sampling of $V_{INF}$ to couple $V_{INF}$ to the various bottom plate conductors of CDAC 4. The CDAC upper plate conductor 34 is coupled by a switch S2 to an output 32 of a mid-voltage buffer 31.

The (−) input of SAR comparator 5 is coupled by conductor 33 to one terminal of a reference capacitance C, which can represent a "dummy" reference CDAC array that is similar to CDAC 4. Conductor 33 is coupled by switch Si to conductor 32. Switches S1 and S2 are controlled by a hold enable signal HOLD_EN, which is generated by SAR logic 10 during the same time that sample enable signal SAMPLE_EN is generated.

Mid-voltage buffer 31 has its output connected to conductor 32 to produce mid-range voltage Vmid on conductor 32, which is fed back to the (−) input of buffer 31. The (+) input of buffer 31 is connected to the junction between voltage divider resistors R1 and R2, which are connected in series between $V_{DD}$ and ground. Voltage divider resistors R1 and R2 may have a resistance of 200 kilohms, so the current through them is very small. Mid-voltage buffer 31 is a low power circuit. Consequently, voltage divider resistors R1 and R2 and mid-voltage buffer 31 do not need to be powered down along with SAR comparator 5 and its associated bias circuitry. The upper terminal of resistor R1 can be coupled to $V_{DD}$ by means of a transistor MP which can be turned off by a system power down signal "SYSTEM POWER DOWN".

The output of SAR comparator 5 is coupled by conductor 6 to an input of a conventional SAR logic circuit 10 (which is included in control logic 21 of FIG. 3) that controls the various switches coupled to CDAC 4 in order to execute a well known SAR ADC algorithm that successively generates the bits of digital output signal DATA, starting with the most significant bit thereof, in response to the ADC_CONVST signal generated by control logic 21 in FIG. 3.

At any particular time, data acquisition system 12 (FIG. 3) can be thought of as operating in one of three modes, namely, a "system power down mode", a "sampling mode", or a "conversion mode". In the system power down mode, all active components on the chip are "shut down" and draw no current from the $V_{DD}$ supply voltage. This includes all components of SAR ADC 2A, including PGA 14 and oscillator 15. The supply voltage $V_{DD}$ remains present, but there is essentially no current draw from it by data acquisition system 12. However, any information stored in digital registers, including FIFO register 26, remains intact.

In the sampling mode, for power up/down signal ADC_CONVST either high or low, PGA 14, oscillator 15, Vmid-buffer 31, and voltage divider R1,R2 are biased on and are active. The signal HOLD_EN is enabled along with the signal SAMPLE_EN. PGA output voltage $V_{16}$ is filtered and the result $V_{INF}$ is coupled to input 18 of CDAC 4 (FIG. 4). SAR comparator 5 and associated bias circuitry (not shown) are controlled by power up/down signal ADC_CONVST. When ADC_CONVST is high, SAR comparator 5 and its bias circuitry are in a powered down state and when ADC_CONVST is low, they are in a powered up state (as indicated in FIG. 5).

In the conversion mode, which begins after the falling edge of ADC_SCLK pulse #2, SAR ADC 2A begins analog to digital conversion, and the switches in block 36 of FIG. 4 are coupled to the bottom plates of the various CDAC capacitors to $V_{REF}$ or GND as the SAR algorithm is performed. (Pulses #1 and pulses #2 of ADC_CLK and FIG. 5 are unneeded "artifacts" of the assignee's above mentioned prior art ADS 7866 data acquisition circuit, which has been modified to provide SAR ADC 2A in FIG. 3.) The signal HOLD_EN is disabled so Vmid is decoupled from conductors 33 and 34 (FIG. 4). The channel of multiplexer 3 is changed during the conversion mode so that the voltage $V_{INF}$ generated by PGA 14 and filter 29 can settle to its appropriate target voltage value while conversion of the previous value of $V_{INF}$ is performed by SAR ADC 2A.

Referring again to FIG. 3, after a first analog channel input signal $V_{IN0}$ is multiplexed to generate $V_{IN}$ at the input of PGA 14 and after settling of above mentioned power-up glitch 42-1 superimposed on the corresponding value of $V_{INF}$ is completed, the system of FIG. 3 switches multiplexer 13 to a second analog channel determined by MUX_ADDR. The new resulting output signal $V_{INF}$ of PGA 14 and filter 29 then begins to settle to an appropriate value while the previous value of $V_{INF}$ sampled by sample/hold circuit 3 is simultaneously being digitized by SAR ADC 2. The foregoing procedure is eventually repeated for each of the remaining analog input channel signals $V_{IN2,3\ldots7}$, respectively.

Figure 5:
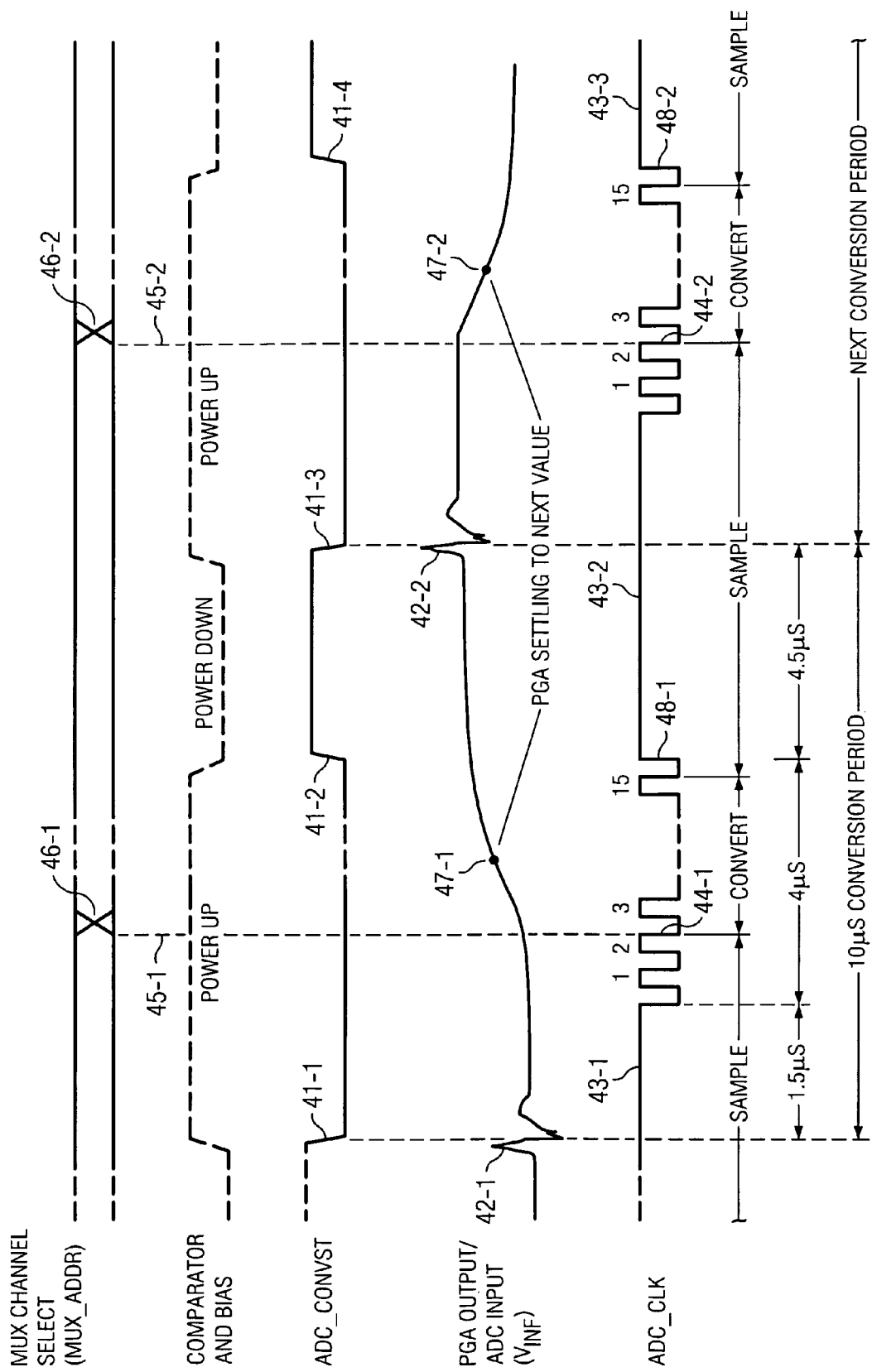
FIG. 5 is a timing diagram for the system of FIGS. 3 and 4.

Referring to FIG. 5, waveforms are shown for multiplexer channel address signal MUX_ADDR, power control signal ADC_CONVST signal on conductor 25A for SAR comparator 5, PGA and filter output signal $V_{INF}$ (which also is the ADC input signal) on conductor 18, and ADC clock signal ADC_CLK. The dashed-line waveform labeled "COMPARATOR AND BIAS" in FIG. 5 is not a signal, but is included to clarify the times during which SAR comparator 5 and associated bias circuitry are powered up and powered down.

SAR ADC 2A is powered up at transition 41-1 of the ADC_CONVST waveform, which causes power-up glitch 42-1 of the $V_{INF}$ waveform. At essentially the same time, power up/down signal ADC_CONVST causes a 1.5 microsecond delay before the ADC_CLK starts a sequence of 15 clock pulses #1, #2 ... #15. At the time of falling edge transition 44-1 of ADC_CLK pulse #2, which occurs 2.0 microseconds after transition 41-1 of ADC_CONVST, sample/hold circuit 3 (FIG. 4) stops sampling $V_{INF}$, and multiplexer address MUX_ADDR changes to determine the next input channel voltage to be multiplexed to the input of PGA 14 and then amplified and filtered to provide the next value of $V_{INF}$. That next value of $V_{INF}$ then is sampled by sample/hold circuit 3 after transition 48-1 of ADC CLK.

This allows the newly sampled next or second value of $V_{INF}$ to settle to its new final value, as indicated by transition 47-1 of the $V_{INF}$ waveform. (For example, when multiplexer 13 switches to the next channel, it may be switching from a previous channel in which the PGA/filter output voltage $V_{INF}$ is only 0.5 volt to a different channel in which the PGA/filter output voltage $V_{INF}$ is 4 volts or more.) Meanwhile, SAR ADC 2A is in the process of converting the previous, i.e., first value of $V_{INF}$ sampled from the previous multiplexer channel, to a corresponding digital value.

SAR ADC 2A is powered down at the end of the foregoing conversion period, i.e., immediately after ADC_CLK pulse #15, as indicated by transition 41-2 of ADC_CONVST. The second value of $V_{INF}$ continues to settle along transition 47-1 of $V_{INF}$ as it continues to be sampled by sample/hold circuit 3. Next, ADC_CONVST causes SAR converter 5 to be powered up, at transition 41-3. This superimposes the second power-up glitch 42-2 on $V_{INF}$, and ADC_CLK remains at level 43-2 for another 1.5 microseconds, and then provides another 15 pulses #1, #2 . . . #15 as before, during which power-up glitch 42-2 can settle. Sampling of $V_{INF}$ stops at the end of ADC_CLK pulse #2, and digitizing of the new value of $V_{INF}$ is continued; also, the next channel of multiplexer 13 is selected at that same time, as indicated by transition 46-2 of MUX_ADDR.

Thus, multiplexer 13 is switched to the next the multiplexer channel as soon as PGA 14 and filter 29 have recovered from the first power-up glitch 42-1, and PGA 14 and filter 29 recover from the switching of multiplexer 13 while analog to digital conversion of the earlier-sampled value of $V_{INF}$ continues. The foregoing process then is repeated to sample the already-settled second value of $V_{INF}$, power up SAR ADC 2 at transition 41-3 of ADC_CONVST, allow the corresponding power-up glitch 42-2 of $V_{INF}$ to settle, and finally convert the second value of $V_{INF}$ to a corresponding digital value. In the described example, the complete conversion of the first settled value of $V_{INF}$ shown in the timing diagram of FIG. 5 requires 10 microseconds. SAR comparator 5 and its associated bias circuitry are powered up during only the first 5.5 microseconds of that 10 microsecond total conversion time and are turned off during the remaining 4.5 microseconds.

It should be appreciated that two settling times for $V_{INF}$ are required. First, power-up glitch 42-1 on the $V_{INF}$ waveform during sampling of a first value of $V_{INF}$ is allowed to settle before its sampling is complete. After the first value of $V_{INF}$ has settled, the multiplexer channel is switched and the resulting second value of $V_{INF}$ is allowed to settle while the SAR ADC 2 simultaneously proceeds with analog to digital conversion of the first value of $V_{INF}$, and so forth.

The above described selecting of the next multiplexer channel to be digitized while the ADC is converting the input signal from previously selected multiplexer channel results in overlapping or "pipelining" of the samples and analog to digital conversions of the multiple input signals $V_{IN0,1\ldots7}$. That greatly increases the data throughput rate of the data acquisition system 12 of FIG. 3.

Consequently, a much lower bandwidth, much lower power PGA 14 can be utilized. That, in combination with powering down of SAR comparator 5 and the low power consumption of the Vmid circuitry including voltage divider resistors R1 and R2, results in a high speed, a very low-power implementation of multi-channel data acquisition system 12, even though PGA 14 and the Vmid circuitry are always turned on.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, in some implementations the sample/hold circuit could be physically located outside of what someone calls the SAR ADC, but within the spirit and scope of the present the sample/hold circuit nevertheless is to be considered part of the SAR ADC. Although the ADC cannot be a delta-sigma ADC, in some implementations it may be advantageous to use an ADC other than a SAR ADC.

What is claimed is:

1. A data acquisition circuit comprising:
    (a) a multiplexer circuit for receiving various input signals and multiplexing them in accordance with a multiplexer address signal to generate various corresponding values of a multiplexer output signal;
    (b) an input amplifier for amplifying the multiplexer output signal to produce an amplified signal;
    (c) a sampling and holding circuit having an input coupled to an output of the input amplifier to receive, sample, and hold the amplified signal;
    (d) a digitizing circuit for digitizing the sampled and held amplified signal to produce a digital signal representative of the multiplexer output signal;
    (e) control circuitry for controlling a time at which at least a portion of the digitizing circuit is powered up for analog to digital conversion operation and controlling a time at which the portion of the digitizing circuit is powered down to reduce power consumption, in response to a power control signal, wherein powering up of the digitizing circuit causes a power-up glitch on the input of the digitizing circuit;
    (f) the control circuitry also providing a first predetermined amount of time between the power-up glitch and a beginning of a conversion process by the digitizing circuit to allow settling of the power-up glitch; and
    (g) the control circuitry also providing a multiplexer address signal to cause the multiplexer circuit to multiplex a next one of the input signals so as to cause a corresponding next value of the amplified signal to occur at a beginning of a conversion by the digitizing circuit of a previous sampled value of the amplified signal,
    wherein the digitizing circuit includes a SAR ADC (successive approximation register analog to digital converter) and wherein the first predetermined amount of time is sufficiently large to allow a bandwidth of the input amplifier to be below a predetermined bandwidth that allows power dissipation of the input amplifier to be below a predetermined level,
    wherein the input amplifier remains in a fully turned on condition during all conversion operation by the SAR ADC.

2. The data acquisition circuit of claim 1 wherein the SAR ADC begins to sample the corresponding next value of the amplified signal immediately after the conversion of the previous value of the amplified signal.

3. The data acquisition circuit of claim 1 wherein the first predetermined amount of delay is approximately 1.5 microseconds.

4. The data acquisition circuit of claim 1 including a serial interface circuit coupled between the control circuitry and an external host system, and also including a FIFO (First in, First out) register coupled between the control circuitry and the serial interface circuit.

5. The data acquisition circuit of claim 1 wherein the control circuitry powers down the portion of the SAR ADC immediately after completion of any conversion by the SAR ADC and powers up the portion of the SAR ADC a second predetermined amount of time after completion of that conversion by the SAR ADC, the second predetermined amount of time being sufficient to allow the next value of the amplified signal to settle.

6. The data acquisition circuit of claim 5 wherein the second predetermined amount of time is 4.5 microseconds.

7. The data acquisition circuit of claim 1 wherein the input amplifier is always powered up during multiplexing, sampling, and conversion operations of the data acquisition circuit.

8. The data acquisition circuit of claim 1 wherein the portion of the SAR ADC that is powered up and powered down includes a SAR comparator.

9. The data acquisition circuit of claim 1 including a voltage divider including first and second resistors coupled to produce a mid-range voltage and a buffer circuit having an input coupled to receive and amplify the mid-range voltage and apply it as a reference voltage to the input of the sampling and holding circuit.

10. The data acquisition circuit of claim 9 wherein the sampling and holding circuit includes first and second switches coupled between an output of the buffer circuit and the first and second inputs of the SAR comparator for selectively coupling the reference voltage to the first and second inputs, respectively, of the SAR comparator while the amplified signal is being applied to the capacitors of a CDAC of the SAR ADC.

11. The data acquisition circuit of claim 9 wherein the voltage divider and the buffer circuit are always powered up during multiplexing, sampling, and conversion operations of the data acquisition circuit.

12. The data acquisition circuit of claim 1 wherein the SAR ADC is a 12 bit SAR ADC.

13. A method of data acquisition, comprising:
multiplexing a first of various input signals in accordance with a multiplexer address signal to generate a corresponding first value of a multiplexer output signal;
amplifying the first value of the multiplexer output signal to produce a first value of an amplified signal;
powering up at least a portion of a digitizing circuit for analog to digital conversion operation in response to a power control signal the powering up causes a power-up glitch to be superimposed on the amplified signal;
beginning sampling and holding of the first value of the amplified signal;
providing a predetermined amount of time between the power-up glitch and a beginning of an analog to digital conversion of the first value of the amplified signal by the digitizing circuit to a digital representation thereof, to allow settling of the power-up glitch before completing the sampling and holding of the first value of the amplified signal;
multiplexing a second of the input signals so as to cause it to be amplified to a second value of the amplified signal after a beginning of the conversion of the first value of the amplified signal by the digitizing circuit;
operating the digitizing circuit to convert the first value of the amplified signal to the digital representation during settling of the second value of the amplified signal; and
powering down the portion of the digitizing circuit at the end of the conversion of the first value of the amplified signal, to reduce power consumption.

14. The method of claim 13 including repeating steps (a) through (h) for successive input signals.

15. The method of claim 1 including providing the digitizing circuit as a SAR ADC (successive approximation register analog to digital converter) wherein the predetermined amount of time is sufficiently large to allow a bandwidth an input amplifier performing the amplifying to be below a predetermined bandwidth that allows power dissipation of the input amplifier to be below a predetermined level.

16. The method of claim 13 including maintaining an input amplifier which performs the amplifying in a fully turned on condition during all conversion operation by the SAR ADC (successive approximation register analog to digital converter).

17. The method of claim 13 including, after the multiplexing of step (f), beginning sampling and holding of the second value of the amplified signal immediately after the conversion of the first value of the amplified signal is complete.

18. A data acquisition system, comprising:
means for multiplexing a first of various input signals in accordance with a multiplexer address signal to generate a corresponding first value of a multiplexer output signal;
means for amplifying the first value of the multiplexer output signal to produce a first value of an amplified signal;
means for operating a digitizing circuit to begin sampling of the first value of the amplified signal;
means for powering up a portion of the digitizing circuit for analog to digital conversion operation in response to a power control signal, wherein the powering up of the digitizing circuit causes a power-up glitch on an input of the digitizing circuit;
means for providing a predetermined amount of time between the power-up glitch and a beginning of conversion of the first value of the amplified signal by the digitizing circuit, to allow settling of the power-up glitch;
means for multiplexing a second of the input signals so as to cause it to be amplified to a second value of the amplified signal after the beginning of a conversion of the first value of the amplified signal to a digital representation thereof by the digitizing circuit;
means for operating the digitizing circuit to convert the first value of the amplified signal to the digital representation during settling of the second value of the amplified signal; and
means for powering down the portion of the digitizing circuit at the end of the conversion of the first value of the amplified signal, to reduce power consumption.

* * * * *